(12) United States Patent
Warden et al.

(10) Patent No.: US 6,563,317 B2
(45) Date of Patent: May 13, 2003

(54) DEVICE FOR THE EXACT CENTERING OF AN NMR SAMPLE TUBE

(75) Inventors: Michael Warden, Pfaffhausen (CH); Roberto Seydoux, Volketswil (CH); Daniel Marek, Moeriken (CH)

(73) Assignee: Bruker BioSpin AG, Fällanden (CH)

( * ) Notice: Subject to any disclaimer, the term of this patent is extended or adjusted under 35 U.S.C. 154(b) by 0 days.

(21) Appl. No.: 10/086,558

(22) Filed: Mar. 4, 2002

(65) Prior Publication Data

US 2002/0135372 A1 Sep. 26, 2002

(30) Foreign Application Priority Data

Mar. 9, 2001 (DE) .......................................... 101 11 672

(51) Int. Cl.[7] ................................................ G01V 3/00
(52) U.S. Cl. ...................................... 324/318; 324/309
(58) Field of Search ............................... 324/318, 320, 324/322, 307, 309; 505/845

(56) References Cited

U.S. PATENT DOCUMENTS 6,466,019 B2    9/2001  Marek ......................... 324/318
6,441,617 B2 *  8/2002  Marek ......................... 324/318

OTHER PUBLICATIONS

"High Resolution NMR Probeheads", Bruker Instruments Inc. 1995 San Jose CA 95134.

* cited by examiner

*Primary Examiner*—Edward Lefkowitz
*Assistant Examiner*—Brij B. Shrivastav
(74) *Attorney, Agent, or Firm*—Paul Vincent

(57) ABSTRACT

A device for centering an elongated sample tube (8), filled with a measuring substance, relative to the vertical axis of an NMR receiver coil system (9) which is rigidly mounted in a support device, is characterized in that at least two centering devices (13,14) are provided which are separated from each other in an axial direction of the receiver coil axis and act on the sample tube in a radial direction only, one of which is disposed above and the other below the NMR receiver coil system, and at least one positioning devices (16;17) which acts on the sample tube in an exclusively axial direction and which can be located either below or above the NMR receiver coil system, wherein the exclusively radially acting centering devices are rigidly connected to the support device for mounting the NMR receiver coil system. This considerably increases the centering accuracy compared to known devices with simple technical devices to obtain optimum results even for measuring capillary sample tubes which pose the highest requirements in centering accuracy.

12 Claims, 5 Drawing Sheets

A — A'

DEVICE FOR THE EXACT CENTERING OF AN NMR SAMPLE TUBE

This application claims Paris Convention priority of DE 101 11 672.1 filed Mar. 9, 2001 the complete disclosure of which is hereby incorporated by reference.

BACKGROUND OF THE INVENTION

The invention concerns a device for centering an elongated sample tube, filled with a measuring substance, relative to the vertical axis of a nuclear magnetic resonance (=NMR) receiver coil system which is rigidly mounted in a support device.

A device of this type is known from the company leaflet "High Resolution NMR, Probeheads" of the Bruker group from 1995.

In NMR spectroscopy, the exact centering of a sample tube relative to the transmitter and receiver coil is an important precondition to obtain optimum sensitivity of the spectrometer. In particular, the radial centering must be especially accurate since the separation between the receiver coil and the sample tube should be as small as possible to obtain an optimum fill factor. For sample tubes with decreasing sizes, the separation between receiver coil and sample tube must decrease linearly to maintain the same fill factor. Therefore, the requirements for the radial positioning accuracy also increase linearly. In the limiting case, the sample tube consists of a so-called measuring capillary and the requirements for the accuracy of the radial centering are particularly high. These measuring capillaries are preferably used for measuring substances which are only present in very small amounts.

Centering devices are known which can be divided into different accuracy levels, depending on the design:

The accuracy level 1 represents the lowest level of centering accuracy. The above-cited company leaflet of Bruker AG e.g. discloses an arrangement (as shown in FIG. 1) with which the sample tube 8 is inserted into the rotor 7a of an air turbine (=spinner) and this spinner is axially and radially centered on the conical guiding surface of the stator 2a of the air turbine located above the receiver coil 9. The stator has a conical guiding surface and is not directly mechanically connected to the receiver coil but is indirectly connected to the upper and lower mounting 11, 12 of the support tube 10 of the receiver coil 9 via the lower support part 3, the lower part of the probe head 4, and finally via the upper part 5 of the probe head. The position of the sample tube relative to the receiver coil therefore depends on a plurality of individual parts having different mechanical tolerances which, in the worst case, could add thereby deteriorating the accuracy and reproducibility of the centering.

In particular, it should be noted that the separation between the conical guiding surface and the receiver coil is relatively large. Consequently, even the smallest angular errors in the alignment of the axis of the conical guiding surface have a large influence on the position of the sample tube at the location of the receiver coil. This influence increases, the larger the separation between the conical guiding surface and receiver coil.

FIG. 2 shows a device with the next higher accuracy level 2. It permits more accurate centering of the sample tube compared to the device of FIG. 1. The sample tube is also located in a spinner 7a which is positioned in an axial and radial direction by the conical guiding surface of the stator 2b of an air turbine which is located above the receiver coil 9. In contrast to the arrangement of FIG. 1, the conical guiding surface of the stator is directly mounted to the upper part 5 of the probe head. Therefore, connecting the conical guiding surface to the receiver coil requires fewer intermediate parts which decreases the possible addition of mechanical tolerances. The separation between the conical guiding surface and the receiver coil is still as large as in FIG. 1 and angular errors in the alignment of the conical guiding surface could also produce large positioning errors in this case.

The unpublished German patent application with the official file number 100 06 324.1-33 describes a device with an even higher accuracy level 3. The sample tube is also located in a spinner which is positioned in an axial and radial direction by the conical guiding surface of the stator of an air turbine which is located above the receiver coil. The conical guiding surface is not directly connected to the upper part of the probe head (similar to FIG. 1) but via various support parts. An important additional feature of this device is a second radial centering which is mounted directly below the receiver coil. This permits nearly complete compensation of the influence of the angular error of the conical guiding surface despite the fact that the separation between the conical guiding surface and receiver coil is similar to the arrangements of FIGS. 1 and 2.

Departing from this prior art, it is the object of the present invention to further increase the centering accuracy compared to the above-described known devices using as simple technical means as possible to achieve optimum results even for measuring capillary sample tubes which require the most accurate centering.

SUMMARY OF THE INVENTION

This object is achieved in accordance with the invention in a surprisingly simple and also effective manner in that at least two centering means are provided which are separated from each other in the axial direction of the receiver coil axis and act only in the radial direction on the sample tube, one of which is disposed above and the other below the receiver coil, and at least one positioning means which acts only in the axial direction on the sample tube, which can be located either below or above the NMR receiver coil, wherein the centering means which act only in the radial direction are rigidly connected to the support device for mounting the receiver coil.

The two axially separated and only radially acting centering means ensure optimum radial centering of the sample tube even if same has the very small diameter of conventional measuring capillaries used for examination of very small substance amounts. The inventive rigid mechanical connection between the two radially acting centering means and a support device to which the NMR receiver coil system is rigidly connected ensures that the sample tube is necessarily radially centered relative to the NMR receiver coil system. Additional and independent axial centering is also provided which ensures very high overall centering accuracy. Moreover, separation of the individual centering functions provides for a particularly high number of degrees of freedom for the geometric design of the overall centering device such that centering can be effected as geometrically close to the receiver coil system as possible.

One particularly simple embodiment of the inventive device is characterized in that the positioning means which acts on the sample tube in the axial direction only is disposed below the NMR receiver coil system and comprises a stop part on which the sample tube is supported in the operating position. Axial centering of the sample tube is therefore technically straightforward but nevertheless precise.

In a further preferred embodiment of the inventive device, the positioning means which acts on the sample tube in the axial direction only, is alternatively disposed above the NMR receiver coil system and comprises a mounting sleeve which is disposed radially around the sample tube like a collar in such a manner that it cannot slip and which, in the operating position of the sample tube, abuts smoothly with a horizontal end face on a horizontal stop surface disposed above the NMR receiver coil system. This embodiment is technically more demanding than that described above, but considerably facilitates handling of the system during operation.

In a particularly advantageous further development of this embodiment, the stop surface for the mounting sleeve is provided in the bottom region on the inside of a rotor which is part of an air turbine for positioning and optionally for rotation of the sample tube and comprises a central axial inner bore having a diameter which is larger than the outer diameter of the mounting sleeve. The outer dimensions of the air turbine can coincide with those of the known conventionally used spinners such that the system is automatically adjusted to existing pneumatic means and modification of this part of the apparatus is not necessary.

The mounting sleeve of these embodiments can be mounted to the sample tube with increased frictional contact to prevent slippage. It is also possible to provide a rigid connection to the sample tube, in particular by gluing or welding, to prevent any displacement of the mounting sleeve when its horizontal end face strikes the associated stop surface.

One embodiment of the inventive device is particularly preferred, with which the two centering means acting exclusively in a radial direction on the sample tube are rigidly connected to each other via axially extending support bars which are disposed in the circumferential direction around the sample tube in its operating position. This ensures a rigid connection between the two radially acting centering means with extremely simple technical means and with a minimum amount of material to further increase the centering accuracy of the sample tube.

The support bars are preferably disposed symmetrically around the sample tube. This also increases the centering accuracy.

In a particularly preferred manner, exactly three support bars are provided. This is sufficient for the mechanical stability of the rigid connection between the two radial centering means while nevertheless permitting significant freedom for mounting the NMR receiver coil system.

The support bars should, in any event, be produced from a material which has no influence on the NMR measurements. Ceramic, glass or quartz material can be advantageously used for the support bars.

One further development of the above-described embodiments is particularly preferred with which the NMR receiver coil system is also rigidly connected to the support bars. This produces the rigid connection between the NMR receiver coil system and the two radially acting centering means which is required in accordance with the invention using the most simplest of technical means and with a minimum amount of material as well as the preferred rigid connection between the two radial centering means with one common mounting device, i.e. the above-described support bars. This optimizes the centering accuracy.

To obtain as large a fill factor as possible, a further development of the above-described embodiments provides for radial disposal of the support bars around the NMR receiver coil system and mounting of the NMR receiver coil system to the inside of these support bars.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 5b shows a horizontal section along the line A—A of FIG. 5a.

DESCRIPTION OF THE PREFERRED EMBODIMENT

Figure 3:
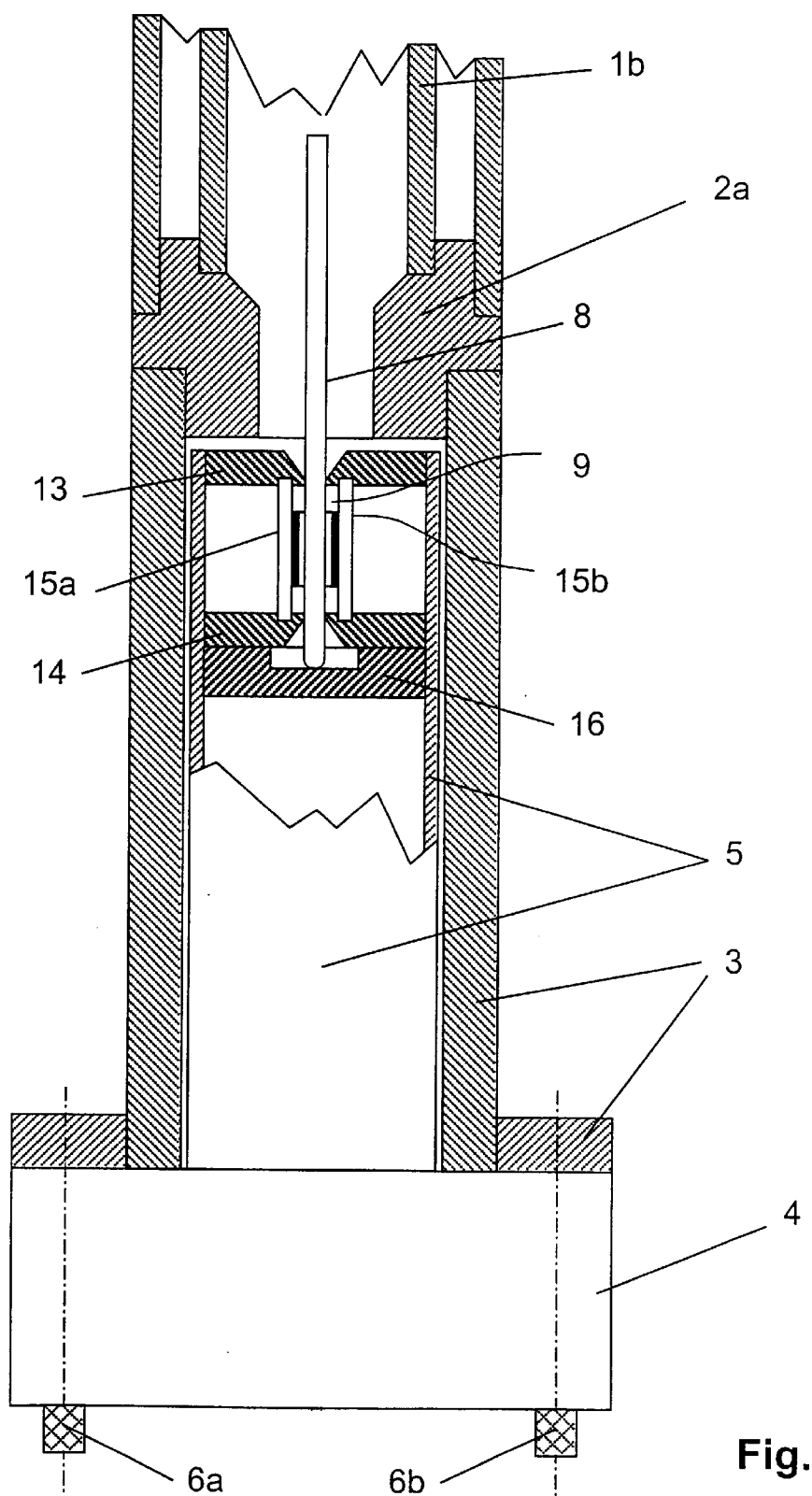
FIG. 3 shows a schematic vertical section through an NMR probe head with inventive centering device without spinner and with lower axial stop of the sample tube.

In the inventive device, the sample tube is only radially centered directly above and below the receiver coil by means of the two centering devices 13 and 14 (FIG. 3). Centering is effected as close as possible to the receiver coil 9 and with as few intermediate parts as possible to ensure high centering accuracy. The optimum minimal separation between the centering device and receiver coil depends on the influence of the susceptibility of the materials used on the NMR resolution and must be determined experimentally.

Axial positioning is carried out separately, either below the receiver coil 9 by means of a stop part 16 (shown in the embodiment of FIG. 3) or above the receiver coil 9, preferably within a modified spinner 7b by means of a mounting sleeve 17 (shown in FIG. 4).

The inventive device produces high radial centering accuracy. The receiver coil 9 can therefore be mounted inside its support device, i.e. directly around the sample tube 8 at a very small distance therefrom, wherein the fill factor that can be achieved is very high (shown in more detail in FIGS. 5a and 5b). The precondition for such an arrangement is the high radial centering accuracy to prevent damage to the receiver coil 9 during insertion of the sample tube 8.

Figure 5A:
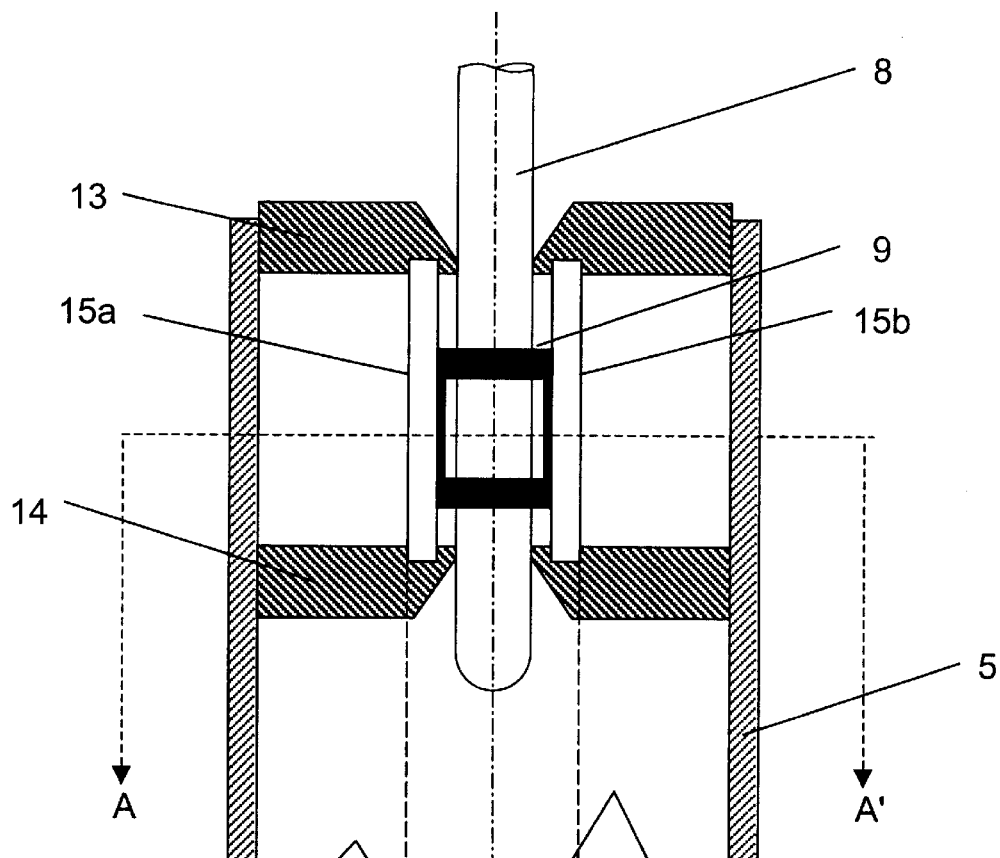
FIG. 5a shows, in more detail, the region around the NMR receiver coil of a device in accordance with FIG. 3 or 4.
Figure 5B:
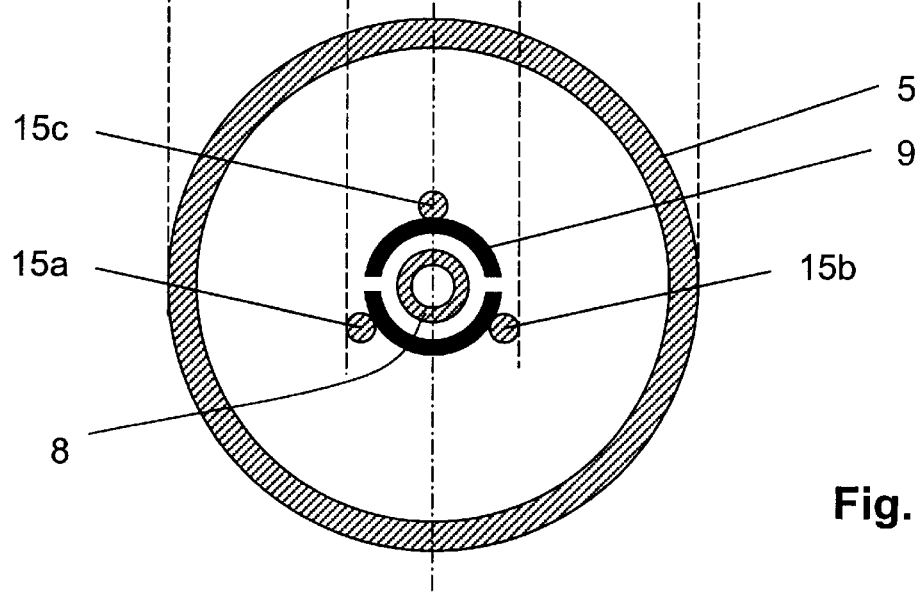

FIGS. 5a and 5b show the inner mounting of the receiver coil 9 at the three support bars 15a, 15b and 15c, holding of the support bars by the two radially acting centering devices 13 and 14 and the slight contact between the two centering devices 13 and 14 and the sample tube 8 thereby producing radial centering directly above and below the receiver coil 9.

FIG. 3 shows a variant of the inventive device, wherein the sample tube is axially positioned below the receiver coil 9 by means of the stop part 16. This variant is advantageous in that it is very simple. Disadvantageous is the fact that insertion of the sample tube 8 is not easy. Insertion from above is only possible using an auxiliary device since the guiding tube 1b of the spinner is relatively long. It is also possible to first remove the probe head 4, 5 by releasing the screws 6a, 6b, inserting the sample tube 8 into the probe head and finally mounting the probe head with the screws 6a, 6b.

Figure 4:
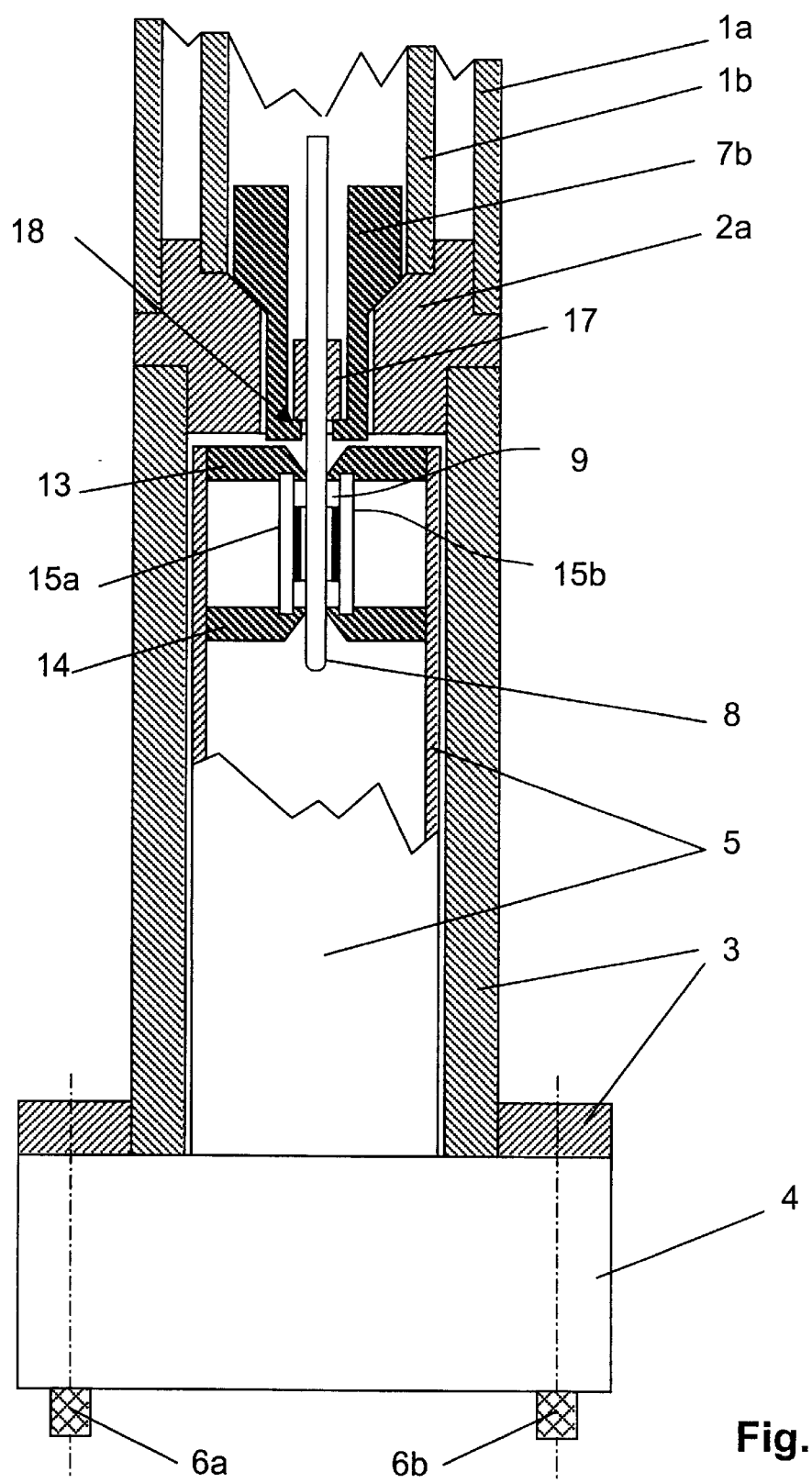
FIG. 4 shows a schematic vertical section through an NMR probe head with inventive centering device including a spinner, which is modified in accordance with the invention, and a mounting sleeve for axial positioning of the sample tube.

FIG. 4 shows axial positioning of the sample tube 8 by means of a spinner which can be easily modified and is located above the receiver coil 9. This solution is more demanding but has important advantages which will be described in detail below. The sample tube 8 is initially securely inserted into a mounting sleeve 17 which can also be permanently glued or welded to the sample tube 8.

The upper region of the spinner 7b has an enlarged bore for loosely receiving the mounting sleeve 17, i.e. with sufficient play in the radial direction. The narrowing in the lower region of the spinner including stop surface 18 on which the mounting sleeve 17 abuts, produces the axial centering.

The spinner 7b, having the same outer dimensions as conventional spinners, is adapted to an existing pneumatic system for transport, supported on an air cushion, from an upper location through the guiding tube 1b to a lower position and back from the lower position to the upper position. The mounting sleeve 17 can move freely in the spinner 7b in an upward direction and, to a limited degree, also in a sideward direction. This prevents the fragile measuring capillary from striking the conical part of the upper centering device 13 when the spinner is lowered, thereby being subjected to additional forces due to the relatively large weight of the spinner which could result in breakage. Due to the fact that there is no rigid connection between the mounting sleeve 17 and spinner 7b, the measuring capillary can abut against the conical part of the centering device 13 and be easily centered there while the spinner 7b can be lowered without carrying along the mounting sleeve 17 and measuring capillary to preclude exertion of additional forces on the measuring capillary.

In this connection, it must be emphasized that conventional use of the pneumatic means for lowering the spinner together with the measuring capillary often caused broken glass. This problem is completely eliminated by the inventive design of the spinner 7b.

Figure 1:
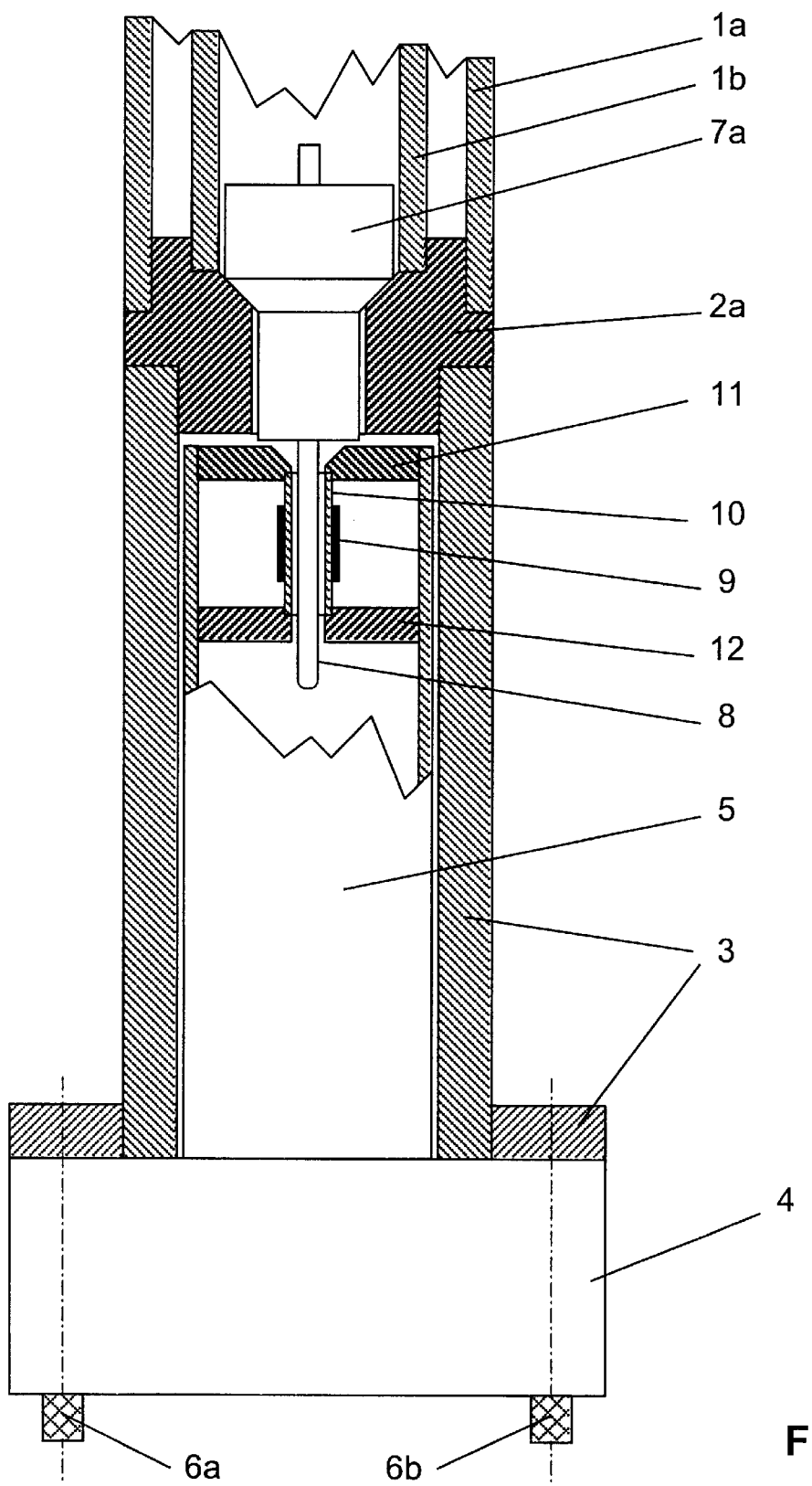
FIG. 1 shows a schematic vertical section through an NMR probe head according to prior art with the accuracy level 1 for centering the sample tube.
Figure 2:
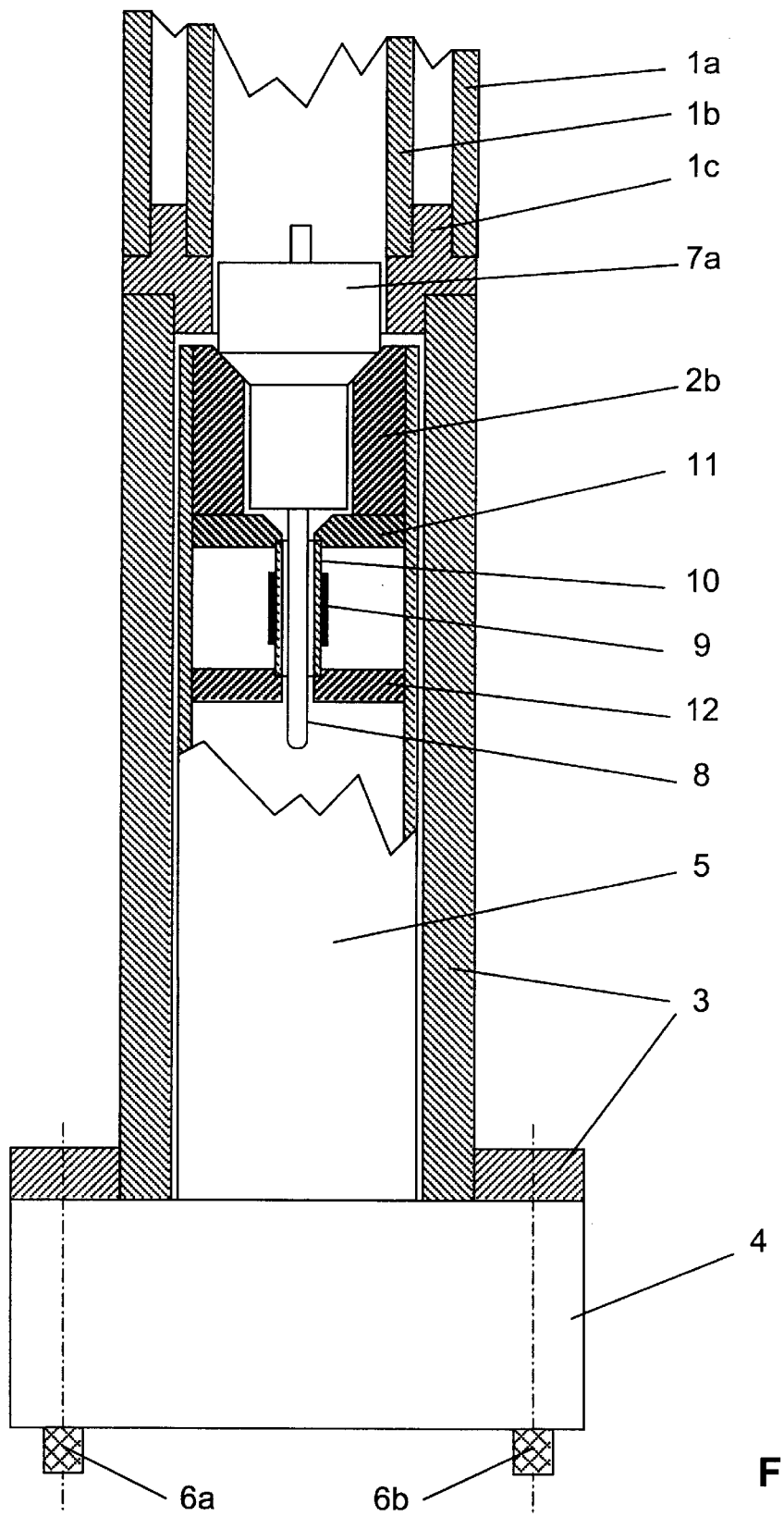
FIG. 2 shows a schematic vertical section through an NMR probe head according to prior art with the accuracy level 2 for centering the sample tube.

LIST OF REFERENCE NUMERALS 1a upper support part (outer shell)
1b upper support part (guiding tube for the spinner)
1c upper support part (lower end flange)
2a stator of the air turbine of FIG. 1, FIG. 3 and FIG. 4
2b stator of the air turbine of FIG. 2
3 lower support part
4 lower part of the probe head
5 upper part of the probe head
6a,b mounting screws which can be unscrewed by hand to facilitate removal of the probe head
7a rotor (=spinner) of the air turbine of FIGS. 1 and 2
7b rotor (=spinner) of the air turbine of FIG. 4 which permits simultaneously pure axial positioning of the sample tube 8
8 sample tube
9 receiver coil (saddle-shaped)
10 support tube of the receiver coil
11 upper mounting part of the support tube 10
12 lower mounting part of the support tube 10
13 upper radial centering means for the sample tube 8 which serves simultaneously also as upper mounting of the three support bars 15a, 15b and 15c of the receiver coil 9
14 lower radial centering means for the sample tube 8 which serves simultaneously also as lower mounting of the three support bars 15a, 15b and 15c of the receiver coil 9
15a,b,c support bars for mounting the receiver coil 9
16 stop part for axial positioning of the sample tube 8
17 mounting sleeve of the sample tube which permits axial positioning of the sample tube in the spinner
18 stop surface

We claim:

1. A device for centering an elongate sample tube, filled with a measuring substance, relative to a vertical axis of a nuclear magnetic resonance (NMR) receiver coil system, the receiver coil system being rigidly mounted within a support device, the centering device comprising:
    a first centering means disposed above the receiver coil system, said first centering means acting on the sample tube in a radial direction only;
    a second centering means disposed below the receiver coil system at an axial separation from said first centering means, said second centering means acting on the sample tube in said radial direction only;
    at least one positioning means disposed above or below the NMR receiver coil system, said positioning means acting on the sample in an axial direction only; and
    means for rigidly connecting said first centering means and said second centering means to the receiver coil system support device.

2. The device of claim 1, wherein said positioning means acting on the sample tube in an exclusively axial direction is disposed below the NMR receiver coil system and comprises a stop part on which the sample tube is supported in an operating position thereof.

3. The device of claim 1, wherein said positioning means acting on the sample tube in an exclusively axial direction is disposed above the NMR receiver coil system and comprises a mounting sleeve which is disposed like a collar to radially surround the sample tube without slippage relative thereto, said mounting sleeve having a horizontal end face in flat abutment with a horizontal stop surface disposed above the NMR receiver coil system in an operating position of the sample tube.

4. The device of claim 3, wherein said stop surface for said mounting sleeve is disposed in a bottom region of an inner side of an air turbine rotor, said air turbine rotor for positioning the sample tube, said air turbine rotor having a central axial inner bore having an inner diameter which exceeds an outer diameter of the mounting sleeve.

5. The device according of claim 3, wherein said mounting sleeve is rigidly connected to the sample tube.

6. The device of claim 5, wherein said mounting sleeve is glued or welded to the sample tube.

7. The device of claim 1, wherein said first and said second centering means are rigidly connected to each other by means of axially extended support bars, said support bars being disposed in a circumferential direction about the sample tube in an operating position thereof.

8. The device of claim 7, wherein said support bars are disposed symmetrically around the sample tube.

9. The device of claim 8, wherein three support bars are provided.

10. The device of claim 7, wherein said support bars are made from one of ceramic, glass and quartz.

11. The device of claim 7, wherein the NMR receiver coil system is also rigidly connected to said support bars.

12. The device of claim 7, wherein said support bars are disposed radially around the NMR receiver coil system.

* * * * *